United States Patent [19]

Kaida

[11] Patent Number: 5,481,154

[45] Date of Patent: Jan. 2, 1996

[54] PIEZO-RESONATOR

[75] Inventor: Hiroaki Kaida, Nagaokakyo, Japan

[73] Assignee: Murata Manufacturing Co., Ltd., Japan

[21] Appl. No.: 312,409

[22] Filed: Sep. 26, 1994

[30] Foreign Application Priority Data

Sep. 28, 1993 [JP] Japan .................... 5-241748
Oct. 21, 1993 [JP] Japan .................... 5-263769

[51] Int. Cl.⁶ .................................................. H01L 41/08
[52] U.S. Cl. ........................ 310/368; 310/320; 310/358
[58] Field of Search .................................. 310/370, 367, 310/368, 358, 359

[56] References Cited

U.S. PATENT DOCUMENTS

| | | | |
|---|---|---|---|
| 3,745,385 | 7/1973 | Nakajima et al. ............. | 310/358 |
| 4,356,421 | 10/1982 | Shimizu et al. ............... | 310/320 |
| 4,384,229 | 5/1983 | Inoue et al. ................... | 310/358 X |
| 5,091,671 | 2/1992 | Yoshida ........................ | 310/358 |
| 5,117,147 | 5/1992 | Yoshida ........................ | 310/358 X |
| 5,118,980 | 6/1992 | Takahashi .................... | 310/358 X |
| 5,121,024 | 6/1992 | Seto .............................. | 310/320 |

FOREIGN PATENT DOCUMENTS 2043995 10/1980 United Kingdom.
2117968 10/1983 United Kingdom.

OTHER PUBLICATIONS

Great Britain Search Report dated Dec. 21, 1994.

Primary Examiner—Mark O. Budd
Attorney, Agent, or Firm—Ostrolenk, Faber, Gerb & Soffen

[57] ABSTRACT

First and second grooves (15, 16) are formed in upper and lower surfaces of a piezoelectric ceramic plate (12), which is polarized in a direction P parallel to its major surfaces, respectively. A resonance part is formed between the first and second grooves (15, 16), so that first and second resonance electrodes (13, 14) which are provided on the upper and lower surfaces of the piezoelectric ceramic plate (12) respectively are opposed to each other through the piezoelectric ceramic plate (12). In this energy trap type piezo-resonator utilizing a thickness shear mode, the resonance part has a pair of rectangular side surfaces, and the first and second grooves (15, 16) are so formed that a ratio b/a is in a range of ±10% from the following value:

$$b/a = n(0.3\sigma + 1.48) \quad (1)$$

assuming that b and a represent lengths of longer and shorter sides of the rectangular side surfaces of the piezoelectric body respectively, σ represents the Poisson's ratio of the material forming the resonance part, and n represents an integer.

16 Claims, 16 Drawing Sheets

PIEZO-RESONATOR

BACKGROUND OF THE INVENTION

1. Field of the Invention

The present invention relates to an energy trap type piezo-resonator utilizing a shear mode, and more particularly, it relates to a piezo-resonator having a structure for effectively trapping vibrational energy in a resonance part.

2. Description of the Background Art

FIG. 1 is a perspective view showing a conventional energy trap type piezo-resonator 1 utilizing a shear mode. This piezo-resonator 1 has a rectangular piezoelectric ceramic plate 2, which is polarized from an end surface 2a toward another end surface 2b along arrow P. Resonance electrodes 3 and 4 are formed on upper and lower surfaces 2c and 2d of the piezoelectric ceramic plate 2, respectively.

The resonance electrodes 3 and 4 extend from the end surfaces 2b and 2a toward a central portion, respectively. The resonance electrodes 3 and 4 are overlapped to be opposed to each other through the piezoelectric ceramic plate 2 in its central region.

When an alternating voltage is applied across the resonance electrodes 3 and 4, the region of the piezo-resonator 1 overlapping the resonance electrodes 3 and 4 with each other, i.e., a resonance part, is excited in a shear mode. In this case, vibrational energy is trapped in the resonance part overlapping the resonance electrodes 3 and 4 with each other so that the vibrational energy hardly leaks toward the end surfaces 2a and 2b.

The piezo-resonator 1 is an energy trap type piezo-resonator utilizing a shear mode. Thus, it is possible to fix the piezo-resonator 1 to a case member or a circuit board by mechanically connecting the piezo-resonator 1 in the vicinity of the end surfaces 2a and 2b.

In such an energy trap type piezo-resonator 1, the vibrational energy must be efficiently trapped in the resonance part; otherwise no desired resonance characteristics can be attained since the vibration is inhibited when the piezo-resonator 1 is mechanically held in the vicinity of the end surfaces 2a and 2b.

In the piezo-resonator 1, it is necessary to increase the element length L in order to efficiently trap the vibrational energy. On the other hand, the resonance frequency of the piezo-resonator 1 depends on the thickness of the resonance part, i.e., the element thickness t. The piezo-resonator 1 has a thickness t of about 0.3 mm when its resonance frequency is 4 MHz, while the piezo-resonator 1 has a thickness t of 0.6 mm when its resonance frequency is 2 MHz, for example.

In order to reliably trap the vibrational energy in the resonance part, however, the element length L must be increased in proportion to the thickness t. For example, the piezo-resonator having a resonance frequency of 4 MHz and a thickness t of 0.3 mm must have a length L of about 5 mm while that having a resonance frequency of 2 MHz and a thickness t of 0.6 mm must have a length L of about 10 mm, in order to reliably trap the vibrational energy in the resonance part.

Consequently, the element length L is inevitably increased in the energy trap type piezo-resonator 1 utilizing a shear mode.

SUMMARY OF THE INVENTION

An object of at least one of the preferred embodiments of the present invention is to provide an energy trap type piezo-resonator utilizing a shear mode, which can effectively improve vibrational energy trap efficiency in its resonance part so that the piezo-resonator is reduced in overall size.

According to one aspect of at least one of the preferred embodiments of the present invention, an energy trap type piezo-resonator utilizing a shear mode comprises a piezoelectric body which is provided with a pair of opposite rectangular surfaces having longer and shorter sides and polarized in a certain direction, and first and second resonance electrodes which are formed on an outer surface of the piezoelectric body. The first and second resonance electrodes are arranged on the outer surface of the piezoelectric body at a prescribed distance from each other, for applying a voltage substantially perpendicularly to the direction of polarization of the piezoelectric body.

The piezo-resonator according to at least one of the preferred embodiments of the present invention is characterized in that, assuming that b and a represent lengths of the longer and shorter sides of the rectangular surfaces of the piezoelectric body and $\sigma$ represents the Poisson's ratio of the material forming the piezoelectric body, a ratio b/a is set in a range of ±10% from the following value:

$$b/a = n(0.3\sigma + 1.48) \quad (1)$$

where n represents an integer.

In the piezo-resonator according to the present invention, an alternating voltage is applied across the first and second resonance electrodes, substantially perpendicularly to the direction of polarization. Thus, the piezo-resonator is excited in a shear mode. Further, the vibration of the shear mode is effectively trapped in the piezo-resonator since the above ratio b/a is set in the range of ±10% from the value satisfying the equation (1). It has been experimentally confirmed by the inventor that it is possible to effectively trap shear mode vibration by setting the ratio b/a in the aforementioned specific range, as described later in detail with reference to the preferred embodiments.

According to at least one of the preferred embodiments of the present invention, shear mode vibration is effectively trapped in the piezoelectric body of the aforementioned piezo-resonator. Thus, it is not necessary to damp vibration in a support structure for manufacturing a component that includes the inventive piezo-resonator, Thus, the support structure for holding the piezo-resonator can be simplified. According to the inventive piezo-resonator, therefore, it is possible to provide a miniature piezoelectric resonance component utilizing a shear mode.

According to a specific aspect of at least one of the preferred embodiments of the present invention, a support part is coupled to the piezoelectric body. In this case, the support part can be reduced in size and simplified in structure since shear mode vibration is effectively trapped in the piezoelectric body. Preferably, such support parts are coupled to both sides of the piezoelectric body, to be capable of further stably supporting the piezoelectric body. More preferably, holding parts are coupled to the support parts which are coupled to both sides of the piezoelectric body. When the holding parts are prepared from members having certain degrees of areas, it is possible to readily and stably fix the piezo-resonator to another member through the holding parts.

According to a more specific aspect of at least one of the preferred embodiments of the present invention, an energy trap type piezo-resonator includes a piezoelectric body, support parts and holding parts which are formed completely by a plate-type member In this case, the piezoelectric body, the support parts and the holding parts can be formed by machining a single piezoelectric substrate, thereby readily providing a plate-type piezo-resonator utilizing a shear mode.

In the aforementioned structure of forming the piezoelectric body, the support parts and the holding parts by machining a single piezoelectric substrate, first and second grooves may preferably be formed in the piezoelectric substrate for forming the piezoelectric body by a piezoelectric substrate portion which is located between the first and second grooves. In this case, it is possible to define the dimensions of the piezoelectric body by working the first and second grooves.

According to still another aspect of at least one of the preferred embodiments of the present invention, case substrates are pasted to upper and lower portions of the piezo-resonator which is formed by the aforementioned single piezoelectric substrate. In this case, a cavity forming means is provided on each case substrate or at least on a portion between the case substrates and the piezo-resonator, in order to define a space for allowing vibration of the vibrating part of the piezo-resonator. It is possible to readily provide a chip-type piezoelectric resonance component by employing the structure obtained by pasting the case substrates on upper and lower portions of the piezo-resonator. Further, it is possible to provide an energy trap chip-type resonance component having stable characteristics due to a cavity which is formed by the cavity forming means for allowing vibration of the vibrating part of the piezo-resonator.

Preferably, first and second spacer plates are coupled to both sides of the piezoelectric substrate, in order to define spaces for allowing vibration of the vibrating part of the piezo-resonator. In this structure further provided with the first and second spacer plates, it is possible to define spaces for allowing vibration also on side portions of the piezo-resonator, while reliably sealing the side portions. Thus, it is possible to provide a chip-type piezoelectric resonance component which is excellent in sealing performance.

More preferably, the first and second spacer plates are integrally formed by the same member as the piezoelectric substrate for forming the piezo-resonator. In this case, no bonded portions are provided between the piezoelectric substrate and the first and second spacer plates, whereby sealing performance of the chip-type piezoelectric resonance component can be further effectively improved. Thus, it is possible to provide a chip-type piezoelectric resonance component which is excellent in environmental characteristics such as moisture resistance.

According to the present invention, the aforementioned piezoelectric body, which is not restricted to a plate type shape but may be formed in an any arbitrary shape, must have a pair of opposite rectangular surfaces having longer and shorter sides, in order to satisfy the aforementioned equation (1). Preferably, the piezoelectric body is formed by a rectangular plate type piezoelectric substrate, which is provided with a pair of rectangular major surfaces and four side surfaces connecting the major surfaces with each other.

When the piezoelectric body is formed by the aforementioned rectangular piezoelectric plate, the pair of resonance electrodes may be provided on both major surfaces of the piezoelectric plate in a spaced manner, on one major surface of the piezoelectric plate at a prescribed distance from each other, or on a pair of opposite side surfaces of the piezoelectric plate. Namely, the pair of resonance electrodes can be properly formed on the outer surface(s) of the piezoelectric body as long as the resonance electrodes can excite shear mode vibration, and positions for forming the resonance electrodes are not particularly restricted but may be modified in various manners, as clearly understood from preferred embodiments described later.

When the structure provided with the resonance electrodes on both major surfaces of the piezoelectric plate is employed in the inventive piezo-resonator, it is possible to provide a piezoelectric resonance component provided with lead wires by arranging a pair of spring terminals for elastically holding the pair of resonance electrodes which are formed on both surfaces and storing the piezo-resonator and the spring terminals in a case.

According to at least one of the preferred embodiments of the present invention, the ratio b/a is selected to be in the range of ±10% from the value satisfying the equation (1), whereby shear mode vibration is effectively trapped in the piezoelectric body. Thus, it is possible to reduce members and parts provided in the exterior of the piezoelectric body in size. Therefore, it is possible to provide a piezo-resonator which is further reduced in size than and superior in resonance characteristics as compared to a conventional piezo-resonator utilizing a shear mode.

The foregoing and other objects, features, aspects and advantages of the present invention will become more apparent from the following detailed description of the at least one of the preferred embodiments of present invention when taken in conjunction with the accompanying drawings.

DESCRIPTION OF THE PREFERRED EMBODIMENTS

Non-restrictive embodiments of the present invention are now described with reference to the drawings, to clarify the present invention.

Figure 1:
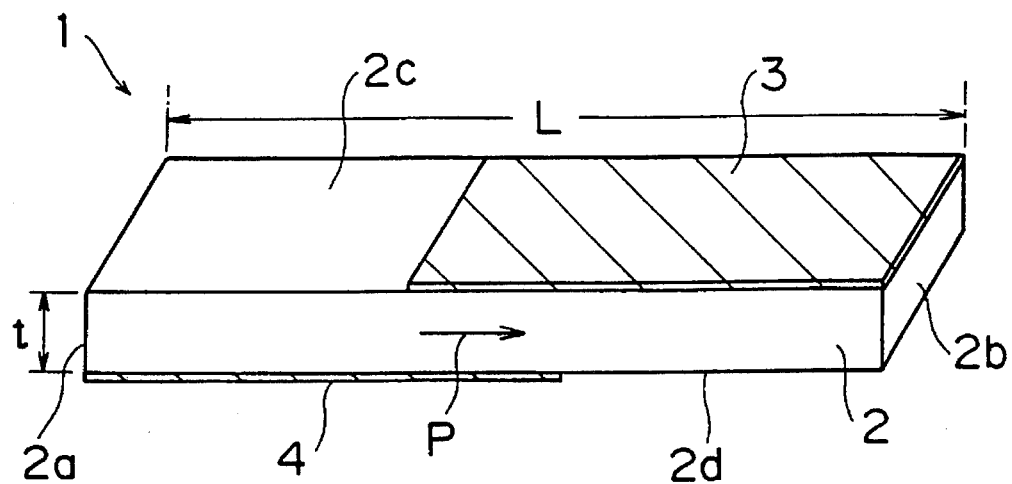
FIG. 1 is a perspective view showing a conventional piezo-resonator utilizing a thickness shear vibration mode.
Figure 2A:
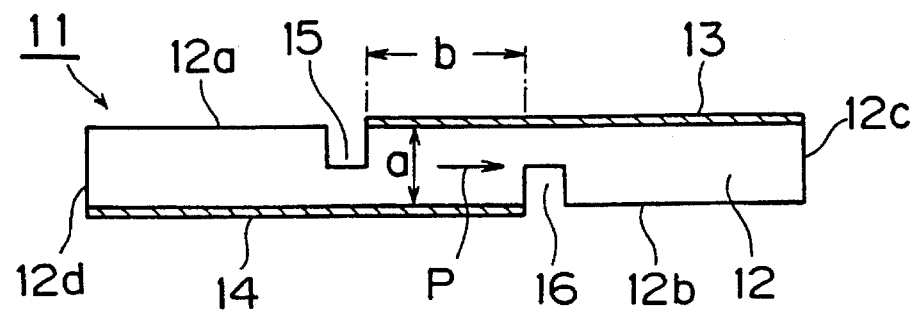
FIGS. 2A and 2B are a side elevational view and a perspective view showing a piezo-resonator according to a first preferred embodiment of the present invention.
Figure 2B:
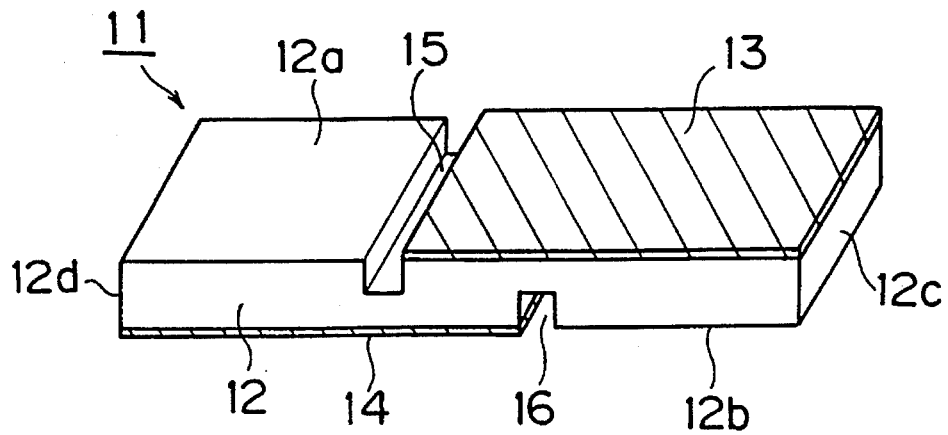

FIGS. 2A and 2B are a side elevational view and a perspective view showing an energy trap type piezo-resonator 11 according to a first preferred embodiment of the present invention.

The piezo-resonator 11 is formed by a rectangular piezoelectric ceramic plate 12, which is polarized so that polarization axes are regularized in a direction parallel to its major surfaces, i.e., along arrow P.

On an upper surface 12a of the piezoelectric ceramic plate 12, a first resonance electrode 13 is formed to extend from a first end surface 12c toward a second end surface 12d, but not to reach the second end surface 12d. On a lower surface 12b of the piezoelectric ceramic plate 12, a second resonance electrode 14 is similarly formed to extend from the second end surface 12d toward the first end surface 12c, but not to reach the first end surface 12c.

Further, cross-directionally extending first and second grooves 15 and 16 are formed in the upper and lower surfaces 12a and 12b of the piezoelectric ceramic plate 12, respectively. In a portion of the piezoelectric ceramic plate 12 which is located between the first and second grooves 15 and 16, the first and second resonance electrodes 13 and 14 are vertically overlapped with each other through the piezoelectric ceramic plate 12, thereby forming a resonance part, i.e., a piezoelectric body portion in the preferred embodiments of the present invention. Namely, the first and second grooves 15 and 16 are formed on forward end portions of the first and second resonance electrodes 13 and 14, respectively, so that the resonance part is defined between the first and second grooves 15 and 16.

Assuming that a represents the length of the resonance part of the piezoelectric ceramic plate 12 along its thickness, i.e., the length of the resonance part which is perpendicular to a direction (first direction) coupling the end surfaces 12c and 12d of the piezoelectric ceramic plate 12 with each other and along the direction (second direction) of depths of the first and second grooves 15 and 16 and b represents the length of the resonance part along the first direction as shown in FIG. 2A while σ represents the Poisson's ratio of the material forming the piezoelectric ceramic plate 12, a ratio b/a is set in a range of ±10% from the following value:

$$b/a = n(0.3\sigma + 1.48)$$

where n represents an integer. In other words, the aforementioned resonance part forming the inventive piezoelectric body has rectangular surfaces which are provided with side surfaces having longer and shorter sides of the lengths b and a, respectively. The grooves 15 and 16 are formed so that the ratio b/a is within the aforementioned specific range, thereby prescribing the dimensions of the resonance part.

Figure 3A:
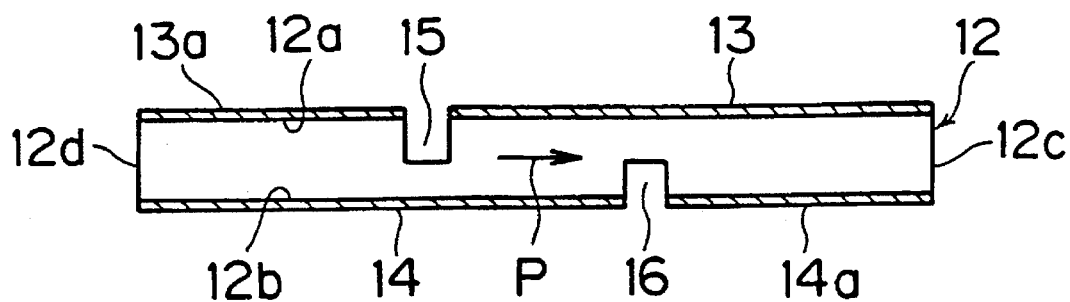
FIGS. 3A and 3B are a side elevational view and a perspective view showing a modification of the piezo-resonator according to the first preferred embodiment of the present invention.
Figure 3B:
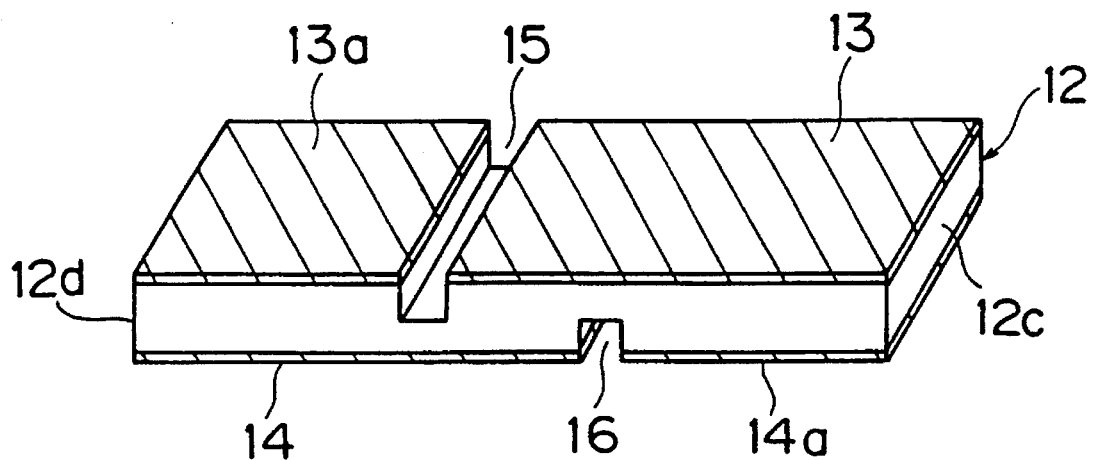

In the piezo-resonator 11 shown in FIGS. 2A and 2B, no electrodes are formed between the first groove 15 and the second end surface 12d and between the second groove 16 and the first end surface 12c in the upper and lower surfaces 12a and 12b of the piezoelectric ceramic plate 12, respectively. Alternatively, electrodes 13a and 14a may be formed on regions between the first groove 15 and the second end surface 12d and between the second groove 16 and the first end surface 12c on the upper and lower surfaces 12 and 12b of the piezoelectric ceramic plate 12, respectively, as shown in FIGS. 3A and 3B. According to this structure, it is possible to define the first and second resonance electrodes 13 and 14 and the electrodes 13a and 14a by forming the first and second grooves 15 and 16 after providing electrodes extending over substantially the major surfaces of the entire piezoelectric ceramic plate 12, so that the piezo-resonator 11 can be formed through a smaller number of steps.

According to this preferred embodiment, it is possible to effectively trap vibrational energy of a shear mode in the resonance part by forming the grooves 15 and 16 so that the ratio b/a is within ±10% of the aforementioned specific range. The reason for this is now described with reference to FIGS. 4A to 11.

Figure 4A:
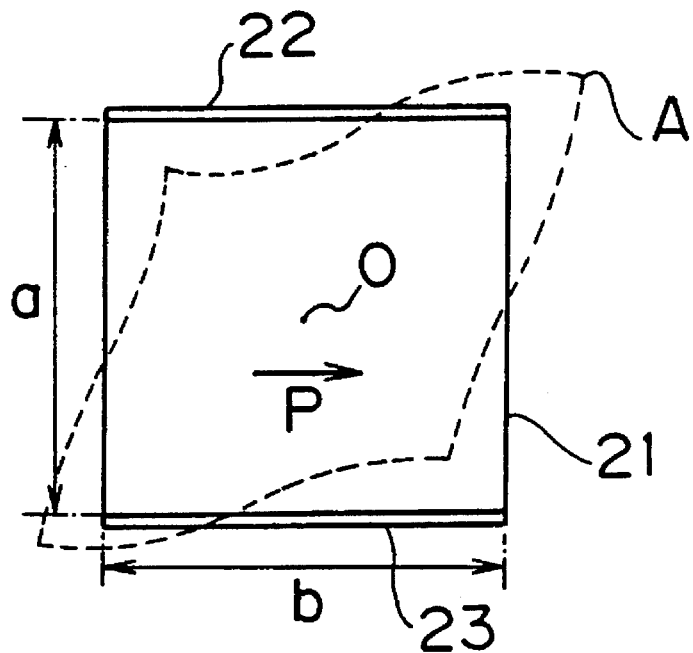
FIGS. 4A and 4B are a schematic side elevational view for illustrating a shear mode in a case of b/a=1 and a model diagram showing positions of respective parts of a vibrator.

As shown in FIG. 4A in a side elevational view, it is assumed that resonance electrodes 22 and 23 are formed on both major surfaces of a piezoelectric body 21, having a ratio b/a of 1, which is polarized along arrow P, i.e., in a direction parallel to its upper and lower surfaces. When an alternating voltage is applied across the resonance electrodes 22 and 23, the piezoelectric body 21 vibrates in a contour shear mode, between a vibrating state shown by broken lines A and another state which is horizontally symmetrical thereto.

Figure 4B:
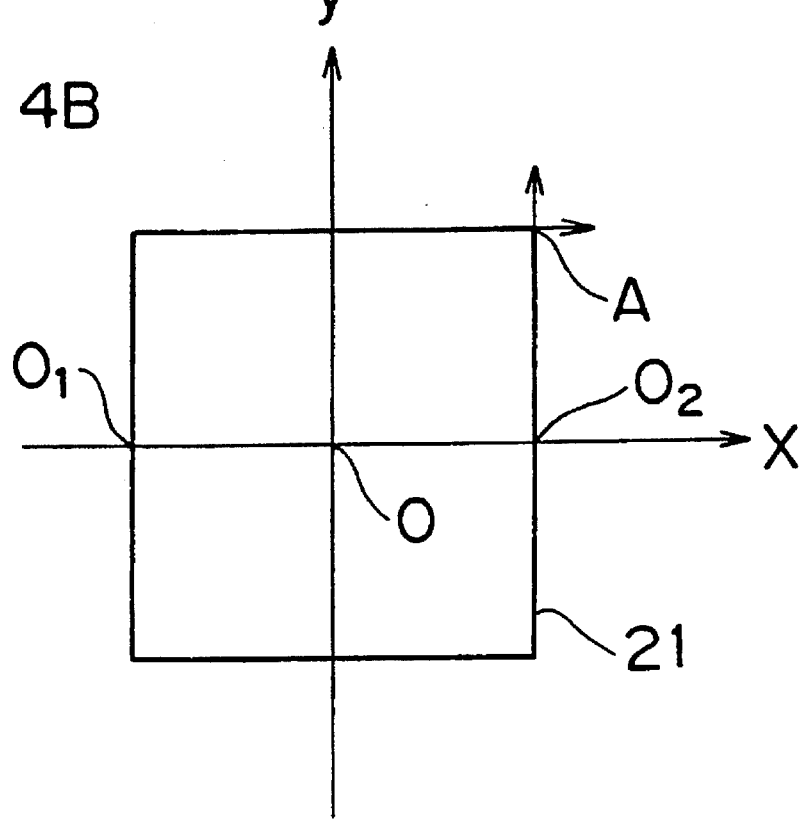

FIG. 4B shows positions of respective parts of the piezoelectric body 21 in an x-y coordinate system. In this case, a corner portion A exhibits the largest displacement in both of directions x and y. A central point O of the piezoelectric body 21 serves as a vibration nodal point. On the other hand, displacement is also recognized in points $O_1$ and $O_2$ in intermediate vertical positions of the side surfaces of the piezoelectric body 21.

Thus, it is understood that vibrational energy trap efficiency is insufficient when a piezo-resonator of a contour shear mode is formed by connecting piezoelectric plates to outer sides of both side surfaces of the piezoelectric body 21, due to the displacement also recognized in the points $O_1$ and $O_2$.

Figure 5:
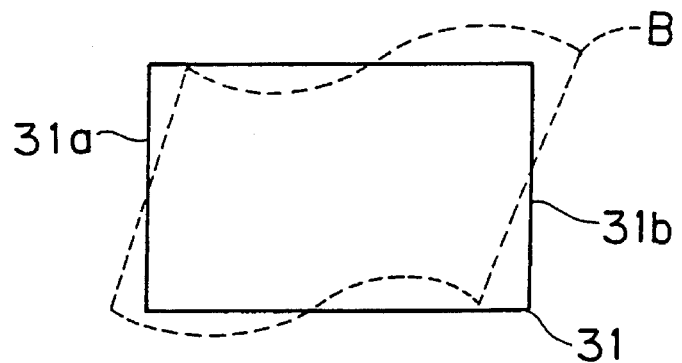
FIG. 5 is a typical side elevational view showing displacement distribution of a piezoelectric vibrator in a case of b/a=0.30+1.48.

On the other hand, FIG. 5 shows displacement distribution which is attained when the ratio b/a is set as follows:

$$b/a = 0/3\sigma + 1.48$$

Figure 6:
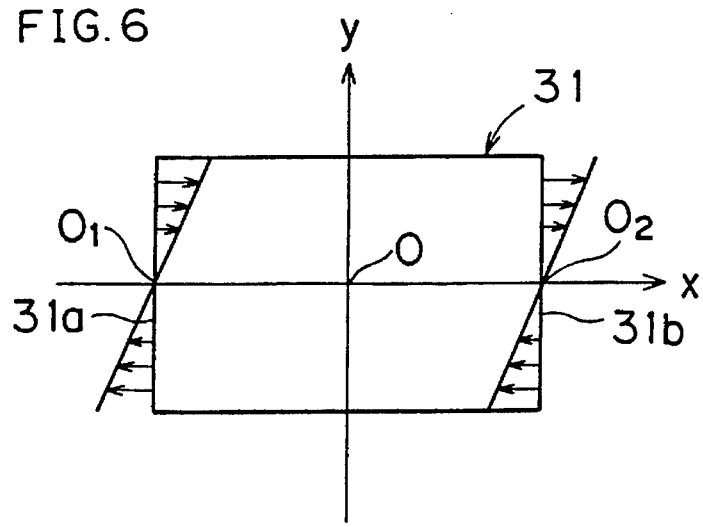
FIG. 6 is a typical side elevational view showing displacement vector distribution on side surfaces upon occurrence of the vibration shown in FIG. 5.

Namely, a piezoelectric body 31 shown in FIG. 5 in a schematic side elevational view vibrates between a vibrating state shown by broken lines B and another state which is horizontally symmetrical thereto. In this case, displacement vectors on shorter sides have only components of the direction x, as shown in FIG. 6. In side surfaces 31a and 31b of the piezoelectric body 31, further, directions of displacement are inverted between upper and lower halves.

Figure 7:
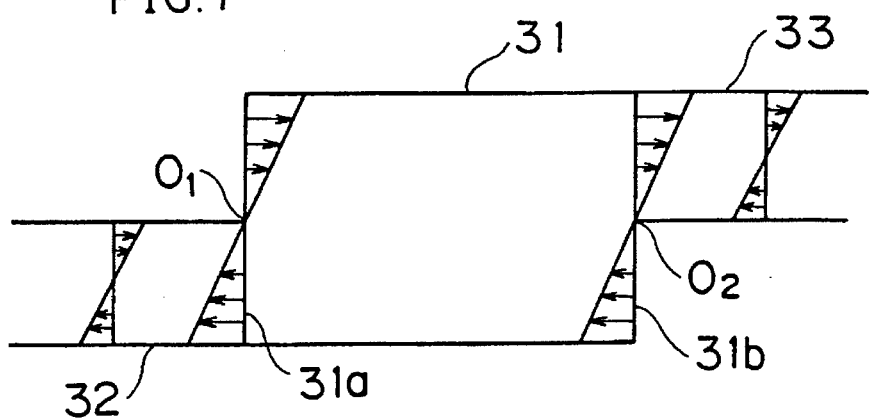
FIG. 7 is a typical side elevational view showing displacement distribution along a direction x in a case of coupling support members to the piezoelectric vibrator shown in FIG. 6.
Figure 8:
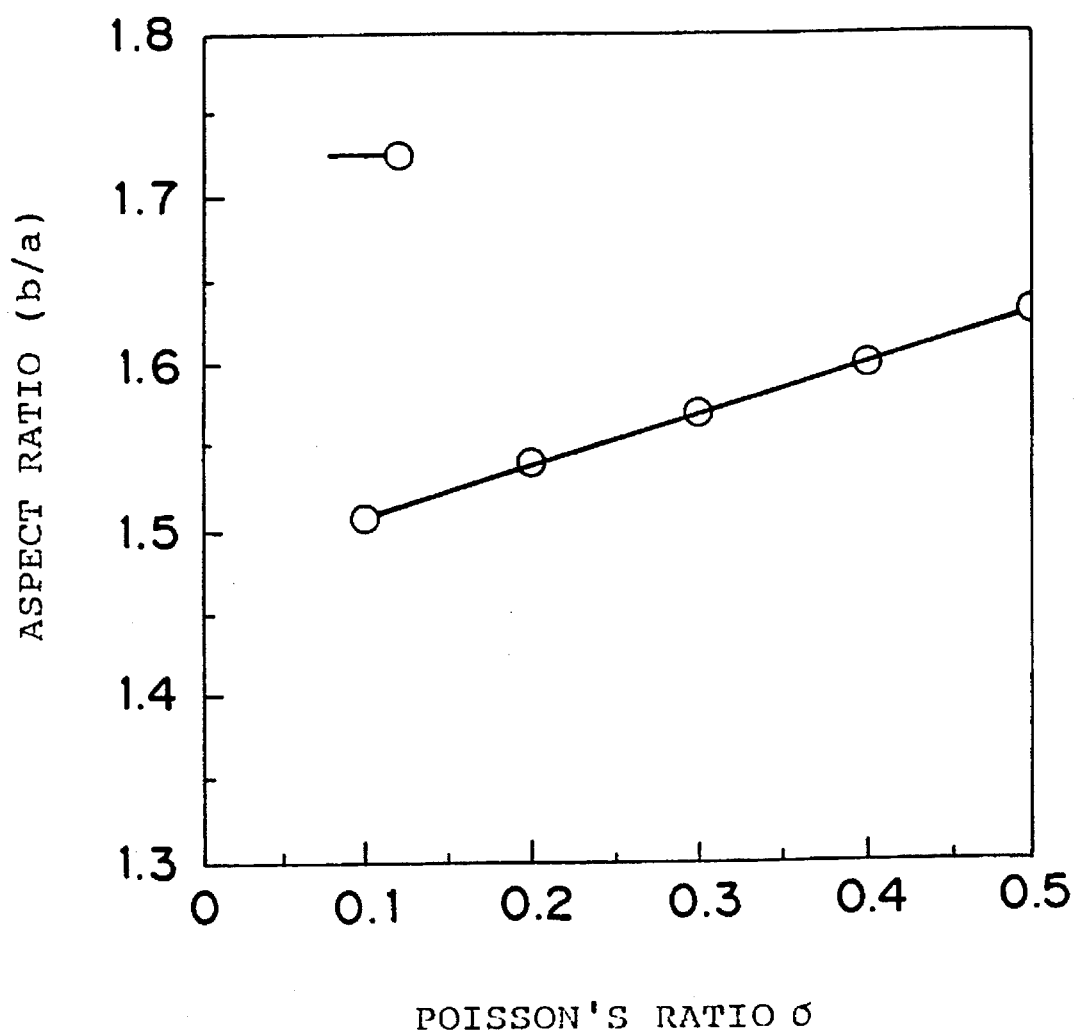
FIG. 8 illustrates relation between the ratio b/a and the Poisson's ratio σ.
Figure 9:
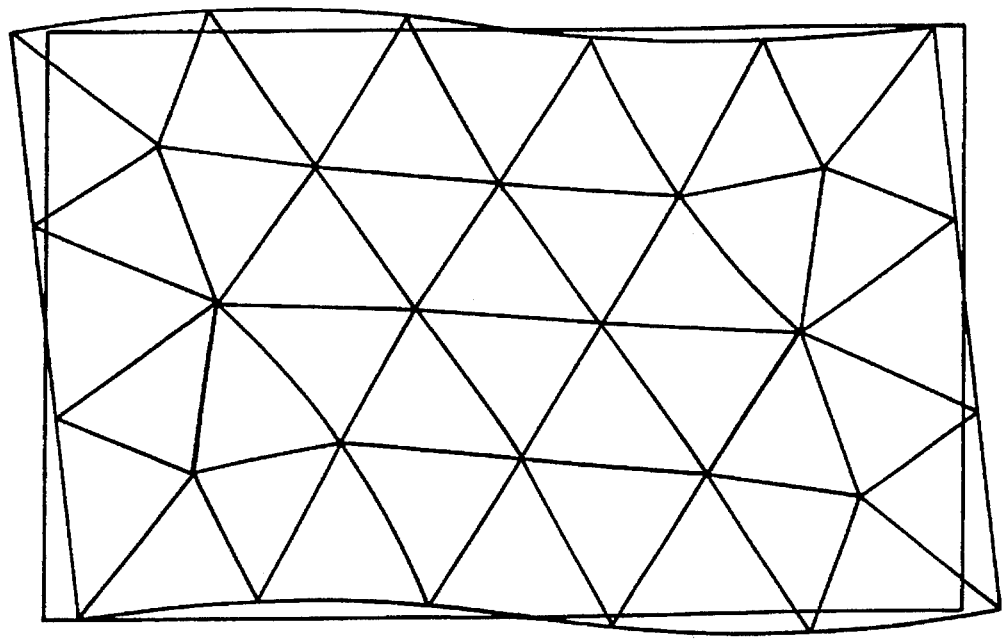
FIG. 9 illustrates displacement distribution of a piezoelectric vibrator, having a Poisson's ratio σ of 0.31 and a ratio b/a of 1.57, analyzed by a finite element method.

The inventor has studied the aforementioned fact, and considered that it may be possible to prevent leakage of displacement in the direction x toward support members 32 and 33 by coupling the support members 32 and 33 to the side surfaces 31a and 31b of the aforementioned piezoelectric body 31 in portion downward and upward beyond the points $O_1$ and $O_2$ at the intermediate vertical positions, respectively, as shown in FIG. 7.

Then, the inventor has varied the ratios b/a with employment of various piezoelectric materials, to investigate states of displacement of structures obtained by connecting such support members 32 and 33 to the piezoelectric body 31. As the a result, it has been confirmed that there is relation shown in FIG. 8 between the Poisson's ratio σ of the piezoelectric material as employed and the ratio b/a. From the result shown in FIG. 8, it has been confirmed possible to reduce transmission of displacement toward the support members 32 and 33, i.e., to effectively trap vibrational energy in the portion of the piezoelectric body 31, by selecting the thickness a of the piezoelectric body 31 and the length b of the vibrating part so that the ratio b/a is set as follows:

$$b/a = n(0.3\sigma + 1.48) \quad (1)$$

where n represents an integer.

While the support members 32 and 33 are coupled to the side surfaces 31a and 31b of the piezoelectric body 31 in the portions downward and upward beyond the points $O_1$ and $O_2$ at the intermediate vertical positions in the model shown in FIG. 7, the intermediate vertical positions are not particularly restricted. In other words, the depths of the grooves 15 and 16 which are formed in the piezoelectric ceramic plate 12 in the aforementioned embodiment may not necessarily be half the thickness of the piezoelectric ceramic plate 12.

As hereinabove described, it has been confirmed that it is possible to effectively prevent transmission of vibration from the piezoelectric body 31 toward the support members 32 and 33 by selecting the dimensions of the resonance part of the piezoelectric body 31 to satisfy the equation (1). On the basis of this result, a piezoelectric material having a Poisson's ratio σ of 0.31 was employed for preparing a piezoelectric vibrator 31 having a ratio b/a of 1.57, which was subjected to measurement of displacement distribution by a finite element method, to attain the result shown in FIG. 9.

Figure 10:
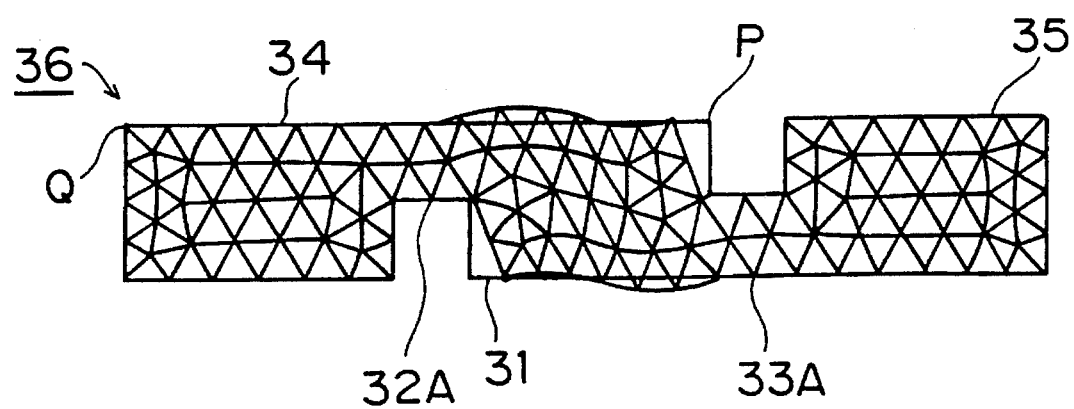
FIG. 10 illustrates displacement distribution of a piezo-resonator formed by providing holding parts on outer sides of the piezoelectric vibrator shown in FIG. 9 through first and second grooves.

Further, FIG. 10 shows the result of displacement distribution of a piezo-resonator 36, which was obtained by integrally forming support parts 34 and 35 having substantially the same thickness as a piezoelectric vibrator 31 through support parts 32A and 33B, measured by a finite element method.

It is clearly understood from FIG. 10 that vibrational energy of a shear mode in the piezoelectric vibrator 31 hardly leaks toward the support parts 32A and 32B in this piezo-resonator 36. Namely, it is understood that it is possible to form a piezo-resonator utilizing a shear mode having high energy trap efficiency, by selecting the ratio b/a to satisfy the equation (1).

Figure 11:
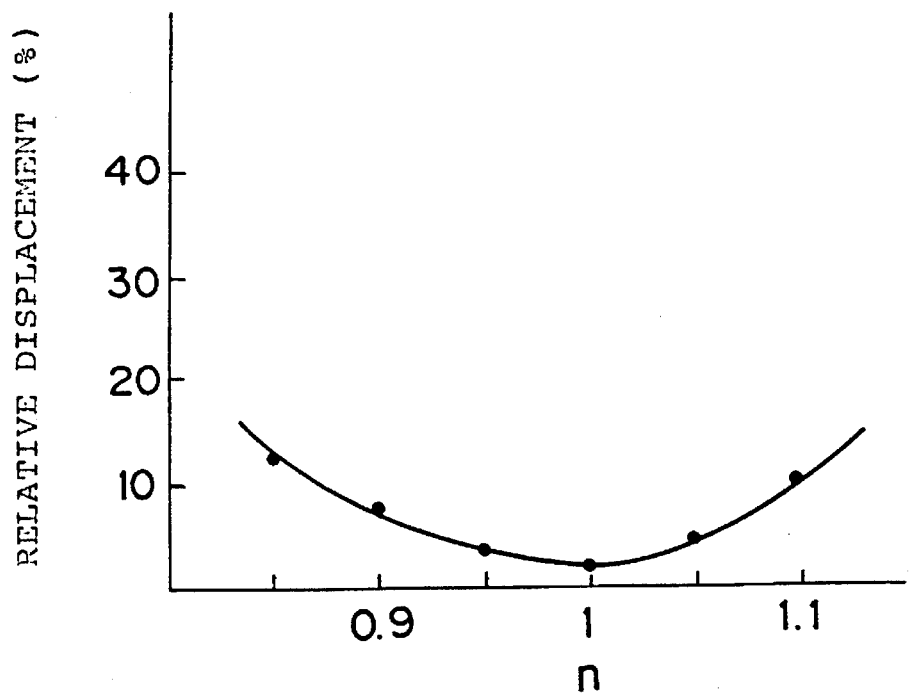
FIG. 11 illustrates relation between the ratio b/a and the amount of relative displacement.

Then, the value n in the above equation (1) was varied between 0.85 and 1.1 at a certain Poisson's ratio σ, to measure ratios of amounts of displacement at a point Q which was displaced at the minimum to those at a point P which was displaced at the maximum shown in FIG. 10, i.e., relative displacement (%). FIG. 11 shows the result.

It is understood from FIG. 11 that the relative displacement is not more than 10% when the value n is in a range of 0.9 to 1.1. On the other hand, it has been recognized that substantially no problem is caused in formation of a piezo-resonator when the relative displacement is not more than 10%. Thus, it is possible to effectively trap vibrational energy in the resonance part when the ratio b/a is within the range of ±10% from a value satisfying the equation (1).

As hereinabove described, it has been recognized that it is possible to effectively improve energy trap efficiency in a piezo-resonator utilizing a shear vibration mode, by setting the relation between the distance between the first and second resonance electrodes in the resonance part and the length b of the resonance part along the direction of polarization within the range of ±10% from the value shown in the equation (1).

In the piezo-resonator 11 according to the first preferred embodiment shown in FIGS. 2A and 2B, therefore, the first and second grooves 15 and 16 are formed so that the ratio b/a of the thickness a in the resonance part of the piezoelectric ceramic plate 12 to the length b of the resonance part along the direction P of polarization is within the range of ±10% from the value expressed in the above equation (1), thereby improving energy trap efficiency.

Figure 12:
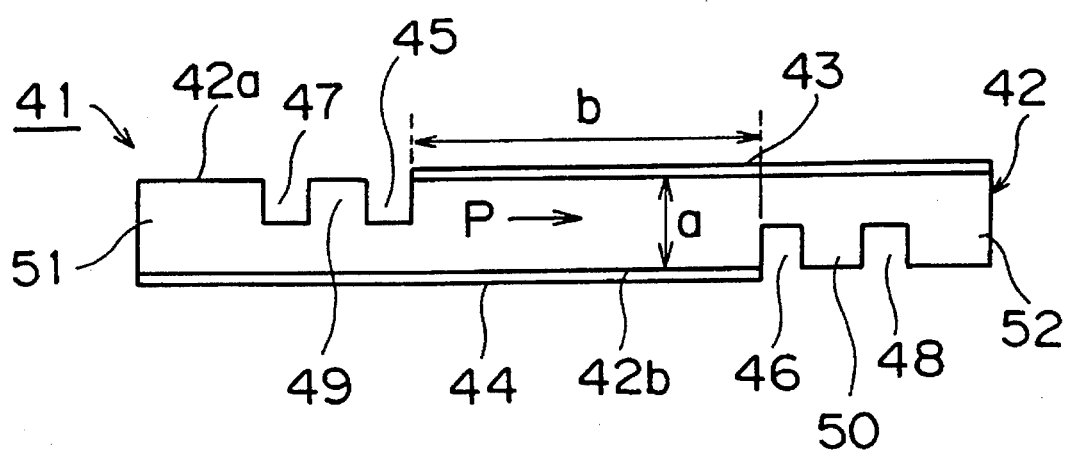
FIG. 12 is a side elevational view showing a piezo-resonator according to a second preferred embodiment of the present invention.

FIG. 12 is a side elevational view showing a piezo-resonator 41 according to a second preferred embodiment of the present invention, in correspondence to FIG. 2A showing the first preferred embodiment.

In the piezo-resonator 41 according to the second preferred embodiment, third and fourth grooves 47 and 48 are preferred formed in upper and lower surfaces 42a and 42b of a piezoelectric ceramic plate 42, which is polarized along arrow P, outside first and second grooves 45 and 46, thereby defining dynamic vibration absorbing parts 49 and 50, respectively. The dynamic vibration absorbing parts 49 and 50 resonate through leaking vibration by a well-known dynamic vibration absorbing phenomenon, for canceling the leaking vibration. Thus, dimensions of the dynamic vibration absorbing parts 49 and 50 are selected so as to cancel the vibration by such a dynamic vibration absorbing phenomenon.

The piezo-resonator 41 according to the second preferred embodiment of the present invention is similar to that of the first preferred embodiment except that the third and fourth grooves 47 and 48 are formed to define the dynamic vibration absorbing parts 49 and 50, and hence other portions are denoted by corresponding reference numerals, to omit redundant description.

In the piezo-resonator 41 according to the second preferred embodiment, the dimensional ratio b/a in its resonance part is set within a range of ±10% from a value expressed in the equation (1), whereby vibrational energy is effectively trapped in the resonance part. Further, slightly leaking vibration is canceled by the dynamic vibration absorbing parts 49 and 50 due to the dynamic vibration absorbing phenomenon. When the piezo-resonator 41 is mechanically held in holding parts 51 and 52 which are outside the third and fourth grooves 47 and 48, therefore, resonance characteristics are hardly deteriorated. Thus, it is possible to further improve energy trap efficiency as compared with the first preferred embodiment, thereby providing a further miniaturized piezo-resonator.

While each of the first and second preferred embodiments has been described with reference to a piezo-resonator utilizing a thickness shear mode, the present invention is also applicable to a piezo-resonator of another shear mode such as a width shear mode.

Figure 13A:
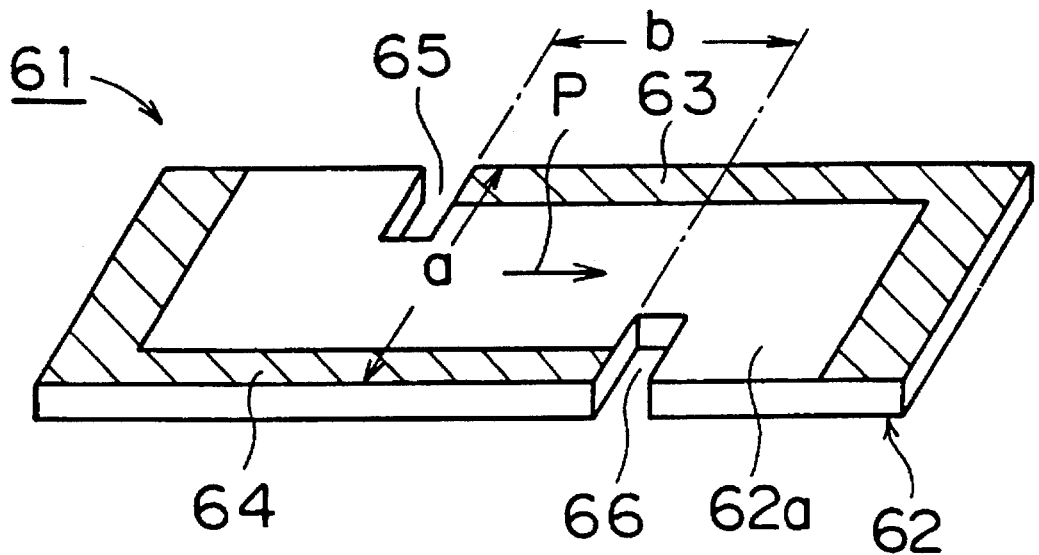
FIGS. 13A and 13B are perspective views showing a piezo-resonator according to a third preferred embodiment of the present invention and a modification thereof respectively.

FIG. 13A shows a piezo-resonator 61, utilizing a width shear mode, according to a third preferred embodiment of the present invention. Referring to FIG. 13A, the piezo-resonator 61 is formed by a rectangular ceramic plate 62, which is polarized along arrow P, i.e., in a direction perpendicular to its upper surface 62a.

A pair of resonance electrodes 63 and 64 are formed to be located along both edges of the piezoelectric ceramic plate 62. The resonance electrodes 63 and 64 extend parallel to the direction P of polarization, to be opposed to each other at a prescribed distance on a central region of the upper surface 62a of the piezoelectric ceramic plate 62.

First and second grooves 65 and 66 are formed on forward ends of the resonance electrodes 63 and 64, respectively, thereby defining a resonance part which is held between the first and second grooves 65 and 66. This resonance part, i.e., a portion forming a piezoelectric body of the preferred embodiments of the present invention, has rectangular upper and lower surfaces. Assuming that a and b represent the lengths of a shorter side direction (second direction) of the upper surface of the resonance part and a direction (first direction) along a longer side of the resonance part, i.e., the direction P of polarization, respectively, it is possible to effectively trap vibrational energy in the resonance part by setting the ratio b/a in the range within ±10% from a value expressed in the equation (1), similarly to the first preferred embodiment.

Figure 13B:
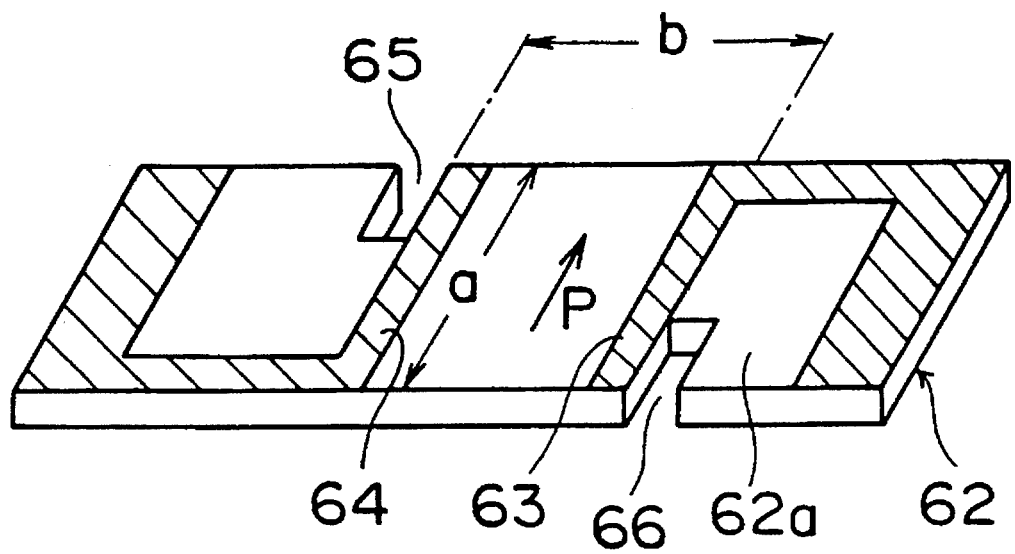

Alternatively, the direction P of polarization may be perpendicular to the longitudinal direction of the piezoelectric ceramic plate 62, i.e., the second direction, as shown in FIG. 13B. In this case, resonance electrodes 63 and 64 extend parallel to shorter sides of the piezoelectric ceramic plate 62, so that an electric field is applied to the resonance part along the longitudinal direction of the piezoelectric ceramic plate 62. Also in the structure shown in FIG. 13B, the shape of the upper surface of the resonance part which is defined between the first and second grooves 65 and 66 is selected so that the ratio b/a is within the range of ±10% from the value expressed in the equation (1). Thus, it is possible to effectively trap vibrational energy of a shear mode in the resonance part.

According to the inventive piezo-resonator, the vibrational energy is effectively trapped as hereinabove described, whereby it is possible to readily form a chip-type electronic component by mechanically holding portions outside the first and second grooves. An example of such a chip-type resonance component 70 is now described with reference to FIGS. 14 and 15.

In the chip-type resonance component 70, first and second case substrate 74 and 75 are pasted to upper and lower portions of a resonance plate 71 with an insulating adhesive, through cavity forming members 72 and 73, respectively.

The resonance plate 71 is formed by a piezo-resonator 76 utilizing a width shear mode, which comprises a rectangular piezoelectric ceramic plate 77 and first and second grooves 78 and 79 formed therein. A resonance part, i.e., a piezoelectric body according to the preferred embodiments of the present invention, is defined between the first and second grooves 78 and 79, while the piezoelectric ceramic plate 77 is polarized along arrow P.

Figure 14:
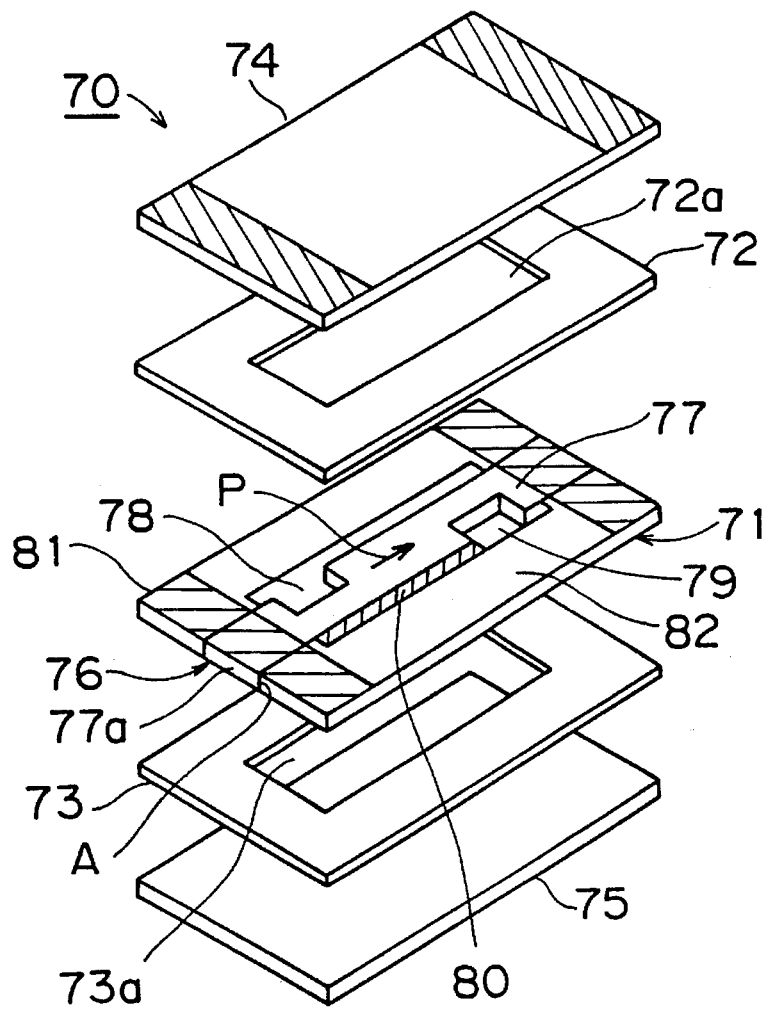
FIG. 14 is an exploded perspective view for illustrating a chip-type resonance component which is formed by the inventive piezo-resonator.

On the other hand, first and second resonance electrodes are formed on side surfaces of the piezoelectric ceramic plate 77. FIG. 14 shows the second resonance electrode 80, which is formed to extend between the second groove 79 and an end surface 77a. On another side surface of the piezoelectric ceramic plate 77, the first resonance electrode (not shown) is formed between the first groove 78 and an end surface which is opposite to the end surface 77a. When an alternating voltage is applied across the first and second resonance electrodes, therefore, the resonance part resonates in a shear vibration mode.

Also according to this preferred embodiment, dimensions of the resonance part are selected so that the ratio b/a is within the aforementioned specific range assuming that a and b represents the length in a direction (second direction), which is perpendicular to the direction (first direction) coupling both end surfaces of the piezoelectric ceramic plate 77 with each other, along the depths of the first and second grooves and the length along the first direction of the resonance part, respectively. Thus, vibrational energy is effectively trapped in the resonance part. On the other hand, first and second spacer plates 81 and 82 are fixed to holding parts, which are provided outside the first and second grooves 78 and 79, by an insulating adhesive, thereby defining a resonance plate 71.

The cavity forming members 72 and 73 have rectangular openings 72a and 73a respectively. These openings 72a and 73a are adapted to form cavities for allowing vibration of the resonance part of the piezo-resonator 76. These cavity forming members 72 and 73 can be prepared from proper materials such as sheet type adhesives or synthetic resin films, which are in the form of rectangular frames.

The case substrates 74 and 75 can be prepared from insulating ceramics such as alumina or another proper insulating material.

While the cavity forming members 72 and 73 which are in the form of rectangular frames are employed in this preferred embodiment, rectangular cavities may be alternatively formed in lower and upper surfaces of the case substrates 74 and 75, respectively, thereby forming cavities for allowing vibration of the resonance part of the piezo-resonator 76. Alternatively, insulating adhesives may be applied to lower and upper surfaces of the case substrates 74 and 75 in the form of thick rectangular frames, respectively, thereby forming cavities for allowing vibration of the resonance part.

Figure 15:
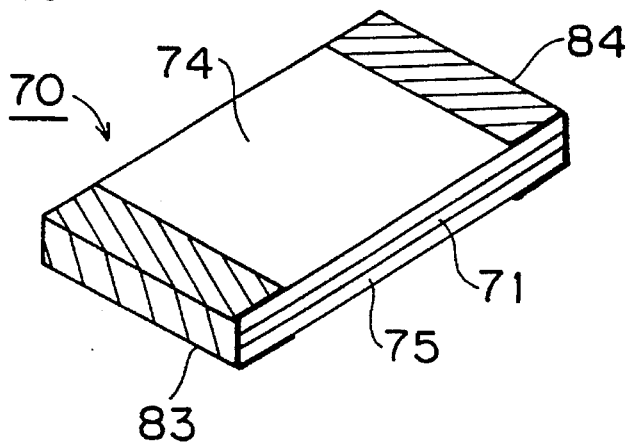
FIG. 15 is a perspective view showing a chip-type piezoelectric resonance component.

The chip-type resonance component 70 is formed by providing external electrodes 83 and 84 on a laminate which is obtained by stacking the aforementioned respective members as shown in FIG. 15. The external electrodes 83 and 84 can be formed by a suitable method such as evaporation, plating or sputtering.

As clearly understood from the chip-type piezoelectric resonance component 70 shown in FIG. 15, it is possible not only to reduce the inventive piezo-resonator in size, but to effectively improve vibrational energy trap efficiency in the resonance part, thereby providing a chip-type resonance component having excellent mechanical strength, which is securely bonded to another member in portions of the piezo-resonator 76 outside the first and second grooves 78 and 79. Thus, it is possible to provide a chip-type resonance component which is excellent in resonance characteristics as well as in reliability.

Figure 16:
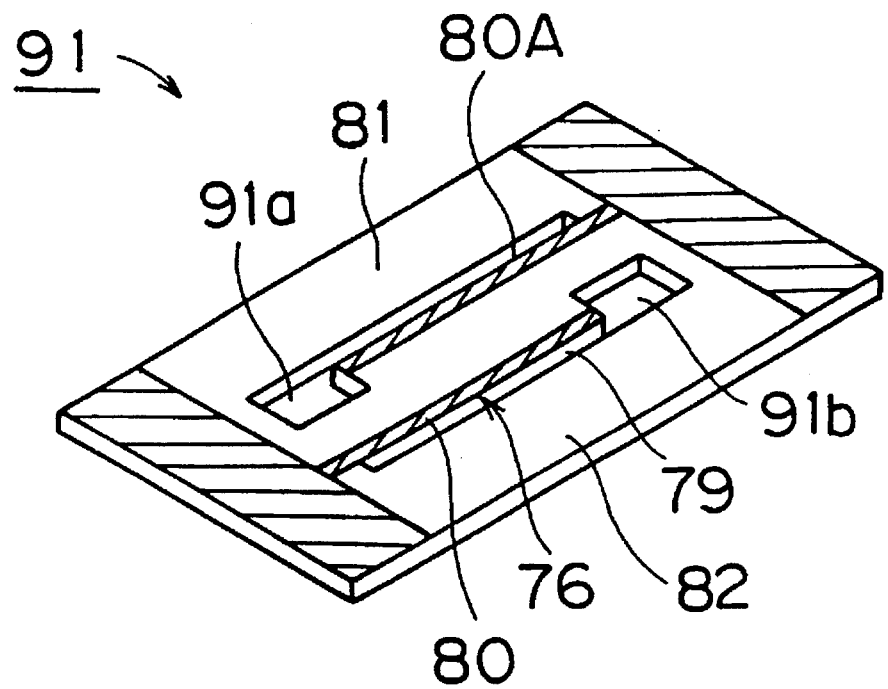
FIG. 16 is a perspective view for illustrating a resonance plate which is formed by an integral member.
Figure 17:
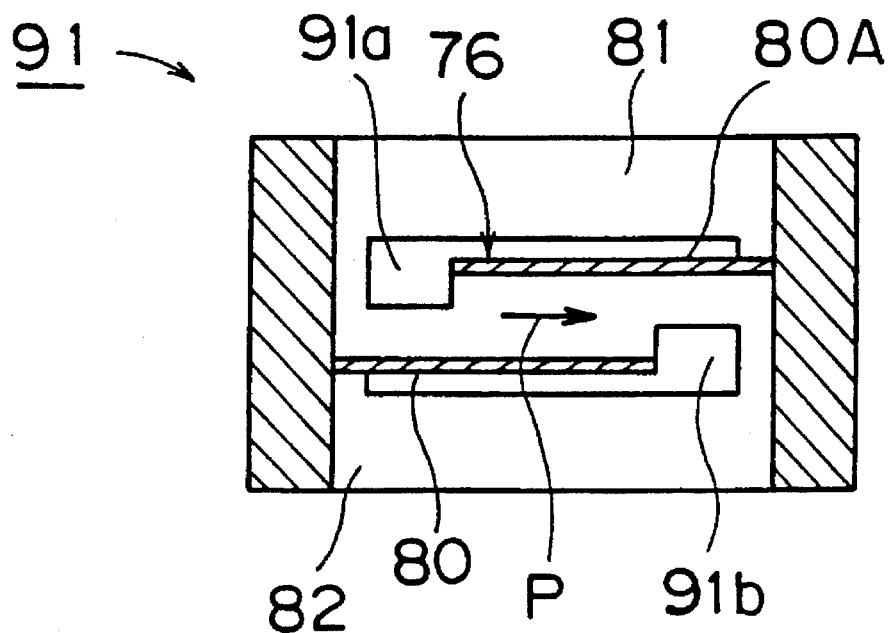
FIG. 17 is a plan view showing the resonance plate shown in FIG. 16.

In the resonance plate 71 shown in FIG. 14, the first and second spacer plates 81 and 82 are preferably bonded to both sides of the piezo-resonator 76 through an adhesive. Thus, a bonded portion A is present, as clearly understood from FIG. 14. If bonding at the bonded portion A is insufficient, moisture etc. may enter the interior through this bonded portion A, to deteriorate characteristics such as moisture resistance. Therefore, a resonance plate 91 may preferably be formed by an integral member, as shown in FIGS. 16 and 17. In this resonance plate 91, a piezo-resonator 96 which is similar in structure to the piezo-resonator 76 shown in FIG. 14 is integrated with first and second spacer plates 81 and 82. Namely, a rectangular piezoelectric ceramic plate is machined to have openings 91a and 91b, and thereafter various electrodes are formed to define the resonance plate 91. Thus, it is possible to further effectively improve moisture resistance of the chip-type piezoelectric resonance component, because the bonded portion A is not required (see FIG. 14). The resonance plate 91 is similar in structure to the resonance plate 71 except that the piezo-resonator 96 and the first and second spacer plates 81 and 82 are integrated with each other and that resonance electrodes 80 and 80A are formed on an upper surface of the piezoelectric ceramic plate in the piezo-resonator 96, and hence portions identical to those of the resonance plate 71 are denoted the same reference numerals, to omit redundant description.

Figure 18:
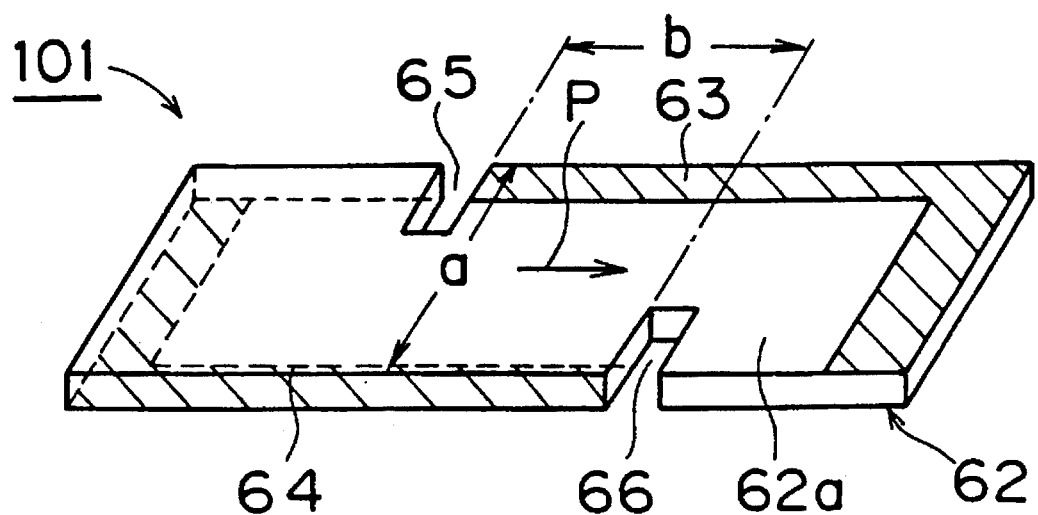
FIG. 18 is a perspective view showing a piezo-resonator according to a fourth preferred embodiment of the present invention.

FIG. 18 is a perspective view showing a piezo-resonator 101 according to a fourth preferred embodiment of the present invention. The piezo-resonator 101 shown in FIG. 18 is a modification of the piezo-resonator 61 shown in FIG. 13B. The former is different from the latter in a point that one resonance electrode 64 is formed on a lower surface of a piezoelectric ceramic plate 62. In other points, the piezo-resonator 101 is similar in structure to the piezo-resonator 61. It is clearly understood from the piezo-resonator 101 that the pair of resonance electrodes of the inventive piezo-resonator may be provided on a pair of rectangular surfaces forming a resonance part, i.e., a piezoelectric body according to the preferred embodiments of the present invention, respectively.

While the resonance part, i.e., the piezoelectric body, the support parts and the holding parts are integrally formed by machining a piezoelectric ceramic plate in each of the aforementioned embodiments, the piezoelectric body, the support parts and the holding parts may alternatively formed by independent members. Such an example is described with reference to FIG. 19.

Figure 19:
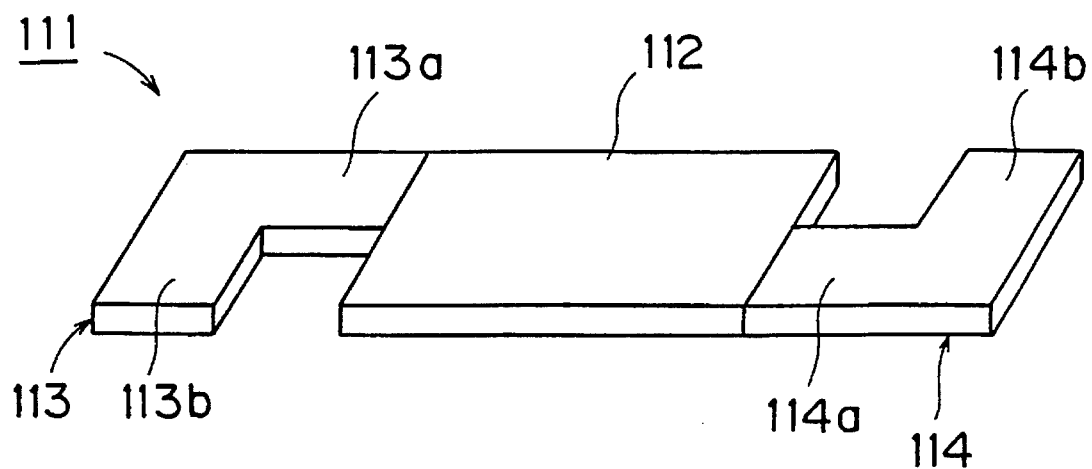
FIG. 19 is a perspective view showing an exemplary plate-type member employed for the inventive piezo-resonator.

In a plate type member 111 shown in FIG. 19, L-shaped plate members 113 and 114 are coupled to side portions of a piezoelectric body 112, having opposite rectangular upper and lower surfaces, through an insulating adhesive. The plate type members 113 and 114 can be prepared from proper materials such as insulating ceramics plates, synthetic resin plates, metal plates or semiconductor plates. Further, the plate type members 113 and 114 have support parts 113a and 114a which are coupled to the piezoelectric body 112, and holding parts 113b and 114b which are employed for mechanically fixing the plate type member 111 to another portion.

Figure 20:
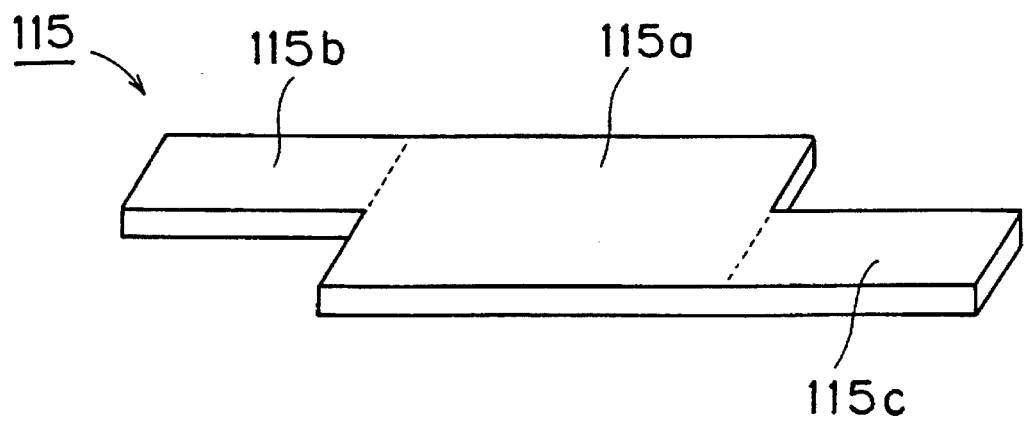
FIG. 20 is a perspective view showing an exemplary piezoelectric substrate employed for the inventive piezo-resonator.

Alternatively, a piezoelectric substrate 115 having support parts and holding parts having substantially the same widths may be employed, as shown in FIG. 20. The piezoelectric substrate 115, which is preferably made of piezoelectric ceramics, has a piezoelectric body portion 115a having upper and lower surfaces forming a pair of rectangular surfaces on its center, while support parts 115b and 115c of narrower widths are formed on both sides of the piezoelectric body portion 115a, respectively. The support parts 115b and 115c are increased in length so that portions close to ends thereof also serve as holding parts.

While the inventive piezo-resonator has been described with reference to a piezoelectric body which is coupled with support parts and holding parts in each of the aforementioned preferred embodiments, the support parts and the holding parts are not requisite for the piezo-resonator according to the preferred embodiments of the present invention. In other words, the inventive piezo-resonator can be formed by a piezoelectric body having a ratio b/a which is selected to be within the range of ±10% from a value satisfying the above equation (1). Such examples are now described with reference to FIGS. 21 to 25.

Figure 21:
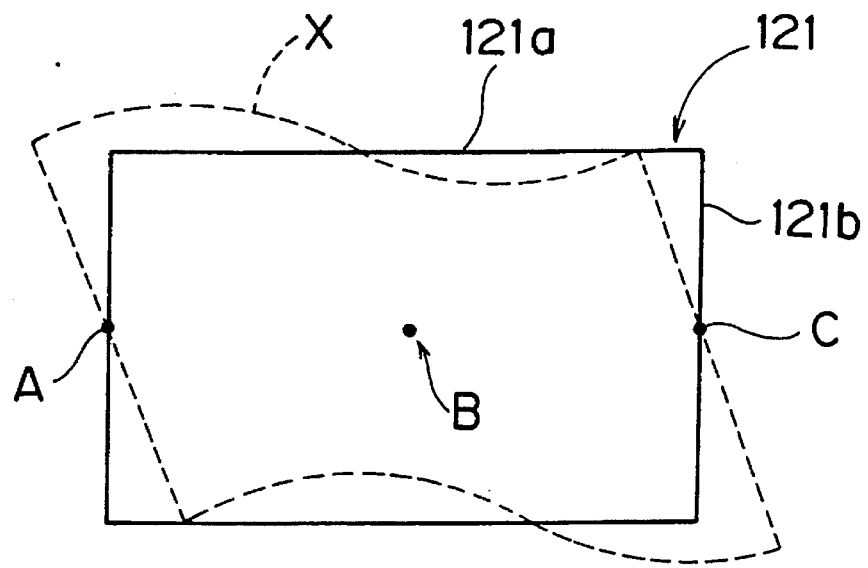
FIG. 21 is a schematic plan view for illustrating nodal points of vibration excited in a shear mode.

When shear mode vibration is excited in a piezoelectric body 121 provided with a pair of opposite rectangular surfaces having longer and shorter sides 121a and 121b of lengths b and a with a ratio b/a which is set in a range of ±10% from a value satisfying the above equation (1), vibration is caused between a vibrating state shown by broken lines X and an opposite vibrating state, as shown in FIG. 21. In this case, vibration nodal points are present at centers of the shorter sides 121b and a center B of each rectangular surface of the piezoelectric body 121, as shown by symbols A, B and C in FIG. 21.

Figure 22:
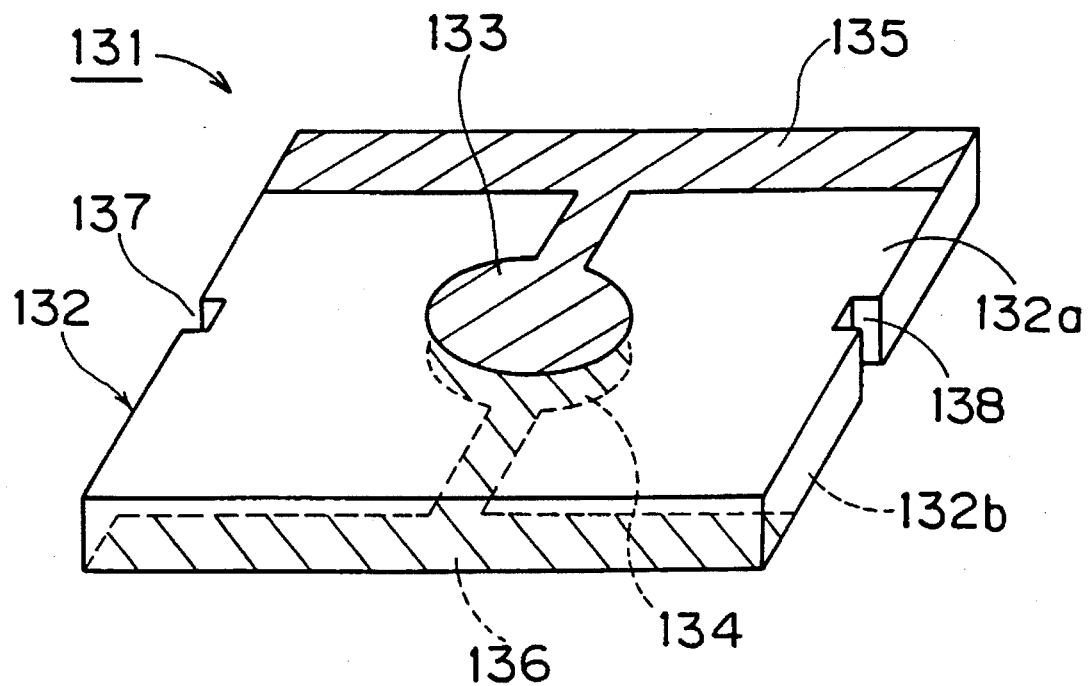
FIG. 22 is a perspective view showing a piezo-resonator according to a fifth preferred embodiment of the present invention.

Thus, it is understood possible to form a piezoelectric resonance component having excellent resonance characteristics by supporting the piezo-resonator on the center B of each rectangular surface. FIG. 22 shows such an example.

In a piezo-resonator 131 shown in FIG. 22, a piezoelectric ceramic plate 132 having rectangular upper and lower surfaces 132a and 132b is employed. In the upper and lower surfaces 132a and 132b, a ratio b/a is set within a range of ±10% from a value satisfying the above equation (1), assuming that b and a represent lengths of longer and shorter sides, respectively, and σ represents the Poisson's ratio of the material for the piezoelectric ceramic plate 132.

First and second resonance electrodes 133 and 134 are formed on centers of the upper and lower surfaces 132a and 132b respectively. The first and second resonance electrodes 133 and 134 are opposed to each other through the piezoelectric ceramic plate 132.

The piezoelectric ceramic plate 132 is polarized in a direction parallel to the upper surface 132a. When an alternating voltage is applied across the first and second resonance electrodes 133 and 134, therefore, the piezo-resonator 132 is excited in a shear mode. Further, the shear mode vibration is effectively trapped in the piezo-resonator 131, since the ratio b/a is selected in the aforementioned manner.

Referring to FIG. 22, terminal electrodes 135 and 136 are formed on the upper and lower surfaces 132a and 132b of the piezoelectric ceramic plate 132 along single edges, respectively. The terminal electrodes 135 and 136 are electrically connected to the first and second resonance electrodes 133 and 134, respectively. The terminal electrodes 135 and 136 are employed for electrical connection with the exterior.

Further, notches 137 and 138 are formed in centers of the shorter sides of the piezoelectric ceramic plate 132 respectively, in order to adjust the resonance frequency. Namely, it is possible to readily adjust the resonance frequency in real time by applying an alternating voltage across the resonance electrodes 133 and 134 for measuring the resonance frequency after forming the piezo-resonator 131, and providing the notches 137 and 138 in proper sizes in this state. Thus, it is possible to readily provide the piezo-resonator 131 having desired resonance characteristics.

While the piezo-resonator 131 is provided with the terminal electrodes 135 and 136, the terminal electrodes 135 and 136 may not necessarily be employed for connection with the exterior. In other words, the terminal electrodes 135 and 136 may not be provided, since it is possible to electrically connect the piezo-resonator 131 with the exterior by bringing spring terminals into contact with the first and second resonance electrodes 133 and 134 which are provided on the centers. Such an example is described with reference to FIGS. 23 to 25.

Figure 23:
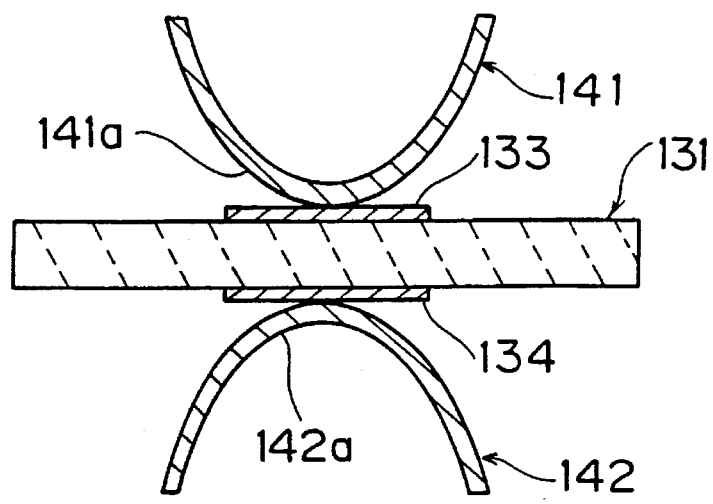
FIG. 23 is a sectional view for illustrating the piezo-resonator shown in FIG. 22 which is brought into contact with elastic contact portions of spring terminals.

As shown in FIG. 23, spring terminals 141 and 142 are brought into contact with resonance electrodes 133 and 134 of a piezo-resonator 131 in this example.

Figure 24:
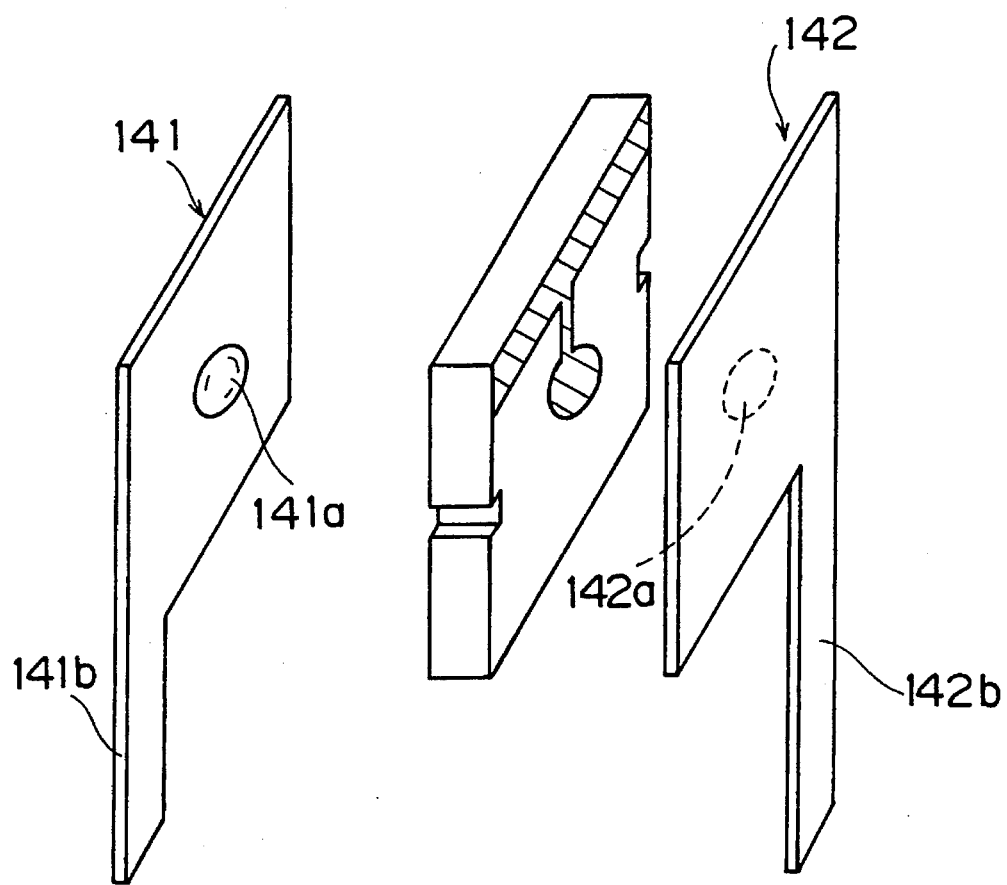
FIG. 24 is a perspective view for illustrating a step of elastically holding the piezo-resonator by a pair of spring terminals.
Figure 25:
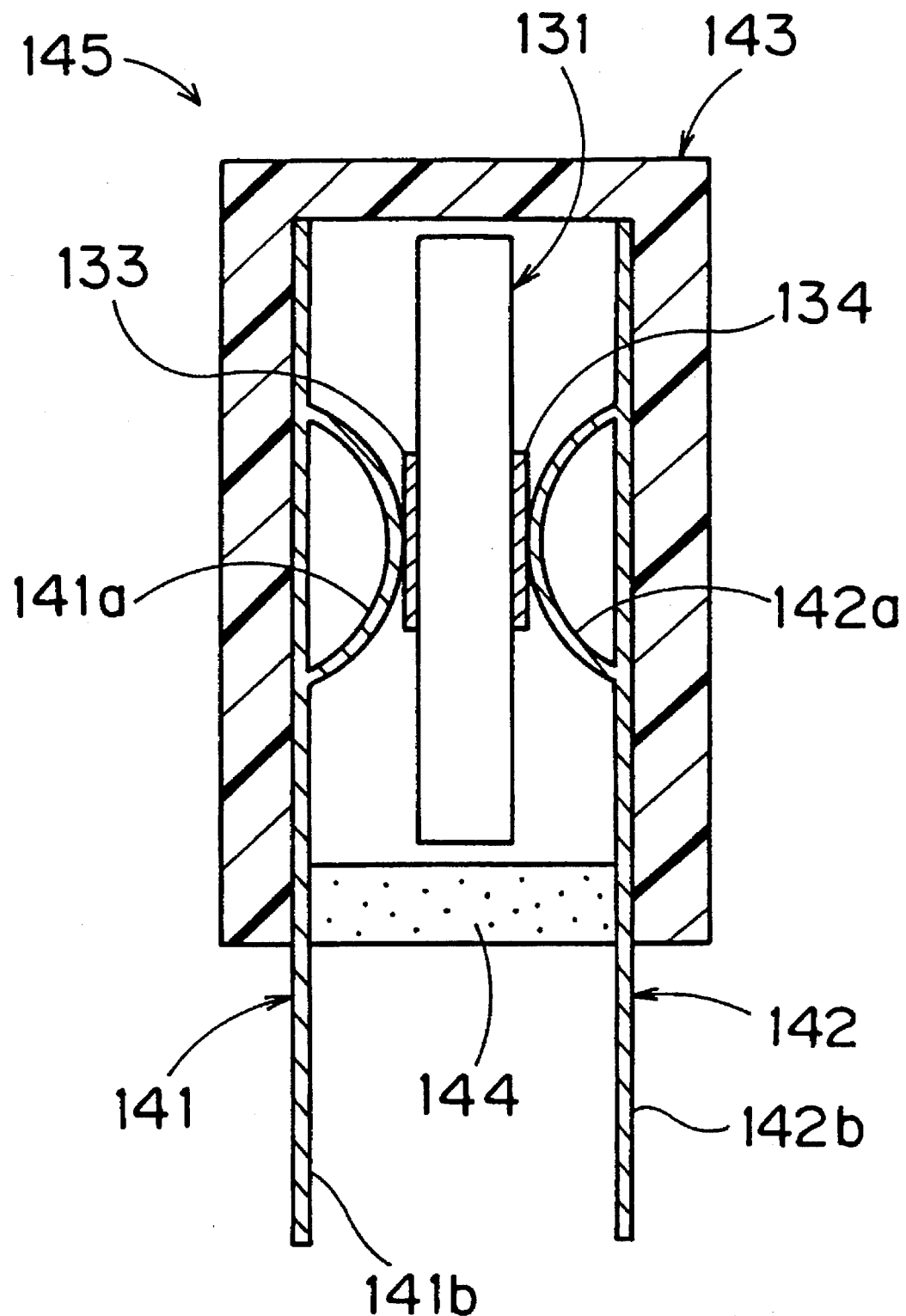
FIG. 25 is a sectional view showing a piezoelectric resonance component provided with lead wires which is formed by holding the inventive piezo-resonator by a pair of spring terminals and storing the same in a case.

FIG. 24 shows concrete examples of the spring terminals 141 and 142. These spring terminals 141 and 142 have semispherically projecting elastic contact parts 141a and 142a, respectively. These elastic contact parts 141a and 142a are shown in FIG. 23. As clearly understood from FIG. 23, the spring terminals 141 and 142 are electrically connected with the resonance electrodes 133 and 134 of the piezo-resonator 131 at the elastic contact parts 141a and 142b, respectively. Further, the spring terminals 141 and 142 have terminal lead portions 141b and 141b, corresponding to portions which are drawn out from a case 143 for receiving the piezo-resonator 131. As shown in FIG. 25, it is possible to form a piezoelectric resonance component 145 provided with lead terminals, by storing the piezo-resonator 131 in the case 143 in a state elastically held by the spring terminals 141 and 142, and sealing the same with sealing resin 144.

The piezo-resonator 131 described with reference to FIGS. 21 to 25 is supported at the nodal points, which are positioned at the centers of both sides 132a and 132b of the piezoelectric plate 132, through contact with the spring terminals.

Figure 26:
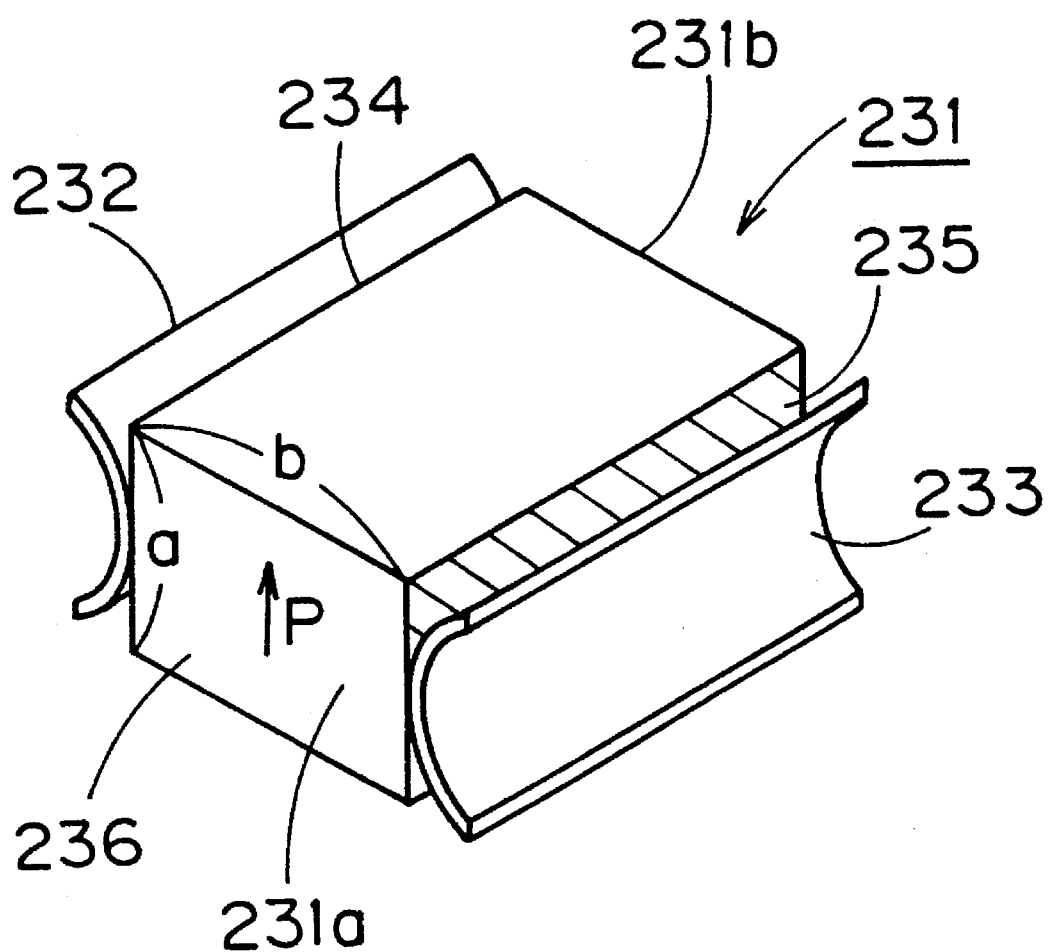
FIG. 26 is a typcal perspective view for illustrating a piezo-resonator according to a sixth preferred embodiment of the present invention, which is supported by a pair of spring terminals.

Alternatively, the inventive piezo-resonator can be supported at the points A and C shown in FIG. 21 by spring terminals. In the vibration mode of the inventive piezo-resonator, the vibration nodal points are also present at the points A and C shown in FIG. 21, i.e., at centers of the shorter side surfaces which are connected with the rectangular surfaces having the ratio b/a of the aforementioned specific range. As shown in FIG. 26, therefore, spring terminals 232 and 233 may be brought into contact with centers of both side surfaces of a piezo-resonator 231, for supporting the piezo-resonator 231 by the spring terminals 232 and 233.

In the piezo-resonator 231 shown in FIG. 26, a pair of opposite surfaces 231a and 231b are formed by rectangular surfaces satisfying the ratio b/a of the aforementioned specific range. Further, resonance electrodes 234 and 235 are formed entirely over side surfaces along shorter sides a. In addition, a piezoelectric body 236 forming the piezo-resonator 231 is polarized along arrow P.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezo-resonator utilizing a shear mode, comprising:
    a piezoelectric body being provided with a pair of opposite rectangular surfaces having longer and shorter sides, and polarized in a certain direction; and
    first and second resonance electrodes being arranged on an outer surface of said piezoelectric body at a prescribed distance from each other, for applying a voltage in a direction being perpendicular to said direction of polarization,
    a ratio b/a being set in a range of ±10% from the following value:

$$b/a = n(0.3\sigma + 1.48) \quad (1)$$

where b and a represent lengths of said longer and shorter sides of said rectangular surfaces of said piezoelectric body respectively, σ represents the Poisson's ratio of the material forming said piezoelectric body, and n represents an integer.

2. A piezo-resonator in accordance with claim 1, further comprising a support part being coupled to said piezoelectric body.

3. A piezo-resonator in accordance with claim 2, wherein said support part is coupled to each side of said piezoelectric body.

4. A piezo-resonator in accordance with claim 3, further comprising a holding part being coupled to each said support part.

5. A piezo-resonator in accordance with claim 4, wherein said piezoelectric body, said support parts and said holding parts are made of plate-type members.

6. A piezo-resonator in accordance with claim 5, wherein said piezoelectric body, said support parts and said holding parts are integrally formed by machining a single piezoelectric substrate.

7. A piezo-resonator in accordance with claim 6, wherein first and second grooves are formed in said piezoelectric substrate, a portion of said piezoelectric substrate being located between said first and second grooves defining said piezoelectric body.

8. A piezo-resonator in accordance with claim 6, further comprising:
    case substrates being pasted to upper and lower portions of said piezo-resonator for holding said piezo-resonator being formed by said single piezoelectric substrate, and
    cavity forming means being provided on said case substrates or between said case substrates and said piezo-resonator for defining spaces for allowing vibration of a vibrating part of said piezo-resonator.

9. A piezo-resonator in accordance with claim 8, further comprising first and second spacer plates being coupled to both sides of said piezoelectric substrate for defining spaces for allowing vibration of said vibrating part of said piezo-resonator.

10. A piezo-resonator in accordance with claim 9, wherein said piezoelectric substrate and said first and second spacer plates are integrally formed by the same member.

11. A piezo-resonator in accordance with claim 1, wherein said piezoelectric body is formed by a piezoelectric plate, said pair of rectangular surfaces being defined by both major surfaces of said piezoelectric body.

12. A piezo-resonator in accordance with claim 11, wherein said piezoelectric plate has four side surfaces coupling said both major surfaces with each other.

13. A piezo-resonator in accordance with claim 12, wherein said pair of resonance electrodes are formed on said both major surfaces of said piezoelectric plate in a dispersed manner.

14. A piezo-resonator in accordance with claim 12, wherein said pair of resonance electrodes are formed on one said major surface of said piezoelectric plate at a prescribed distance from each other.

15. A piezo-resonator in accordance with claim 12, wherein said pair of resonance electrodes are formed on an opposite pair of said side surfaces of said piezoelectric plate.

16. A chip-type piezo-resonator in accordance with claim 13, further comprising:

a pair of spring terminals for elastically holding said pair of resonance electrodes being provided on said both major surfaces of said piezo-resonator, and a case for storing said piezo-resonator and said spring terminals.

* * * * *